(12) United States Patent
Ho et al.

(10) Patent No.: US 7,600,310 B2
(45) Date of Patent: Oct. 13, 2009

(54) METHOD OF HEAD STACK ASSEMBLY FLEXIBLE CIRCUIT ASSEMBLY ATTACHED TO AN ACTUATOR ARM

(75) Inventors: Yiu Sing Ho, Ma On Shan Shatin (HK); Hiroshi Fukaya, Tai Koo Shing (HK); Kam Fung Yip, Tuen Mun (HK); Satoshi Yamaguchi, Kowloon (HK); Jeffery L. Wang, Tai Po (HK); Can Hua Chen, Dongguan (CN)

(73) Assignee: SAE Magnetics (H.K.) Lts., Shatin, N.T. (HK)

( * ) Notice: Subject to any disclaimer, the term of this patent is extended or adjusted under 35 U.S.C. 154(b) by 39 days.

(21) Appl. No.: 11/454,599

(22) Filed: Jun. 16, 2006

(65) Prior Publication Data

US 2006/0232890 A1    Oct. 19, 2006

Related U.S. Application Data

(62) Division of application No. 10/753,911, filed on Jan. 7, 2004.

(51) Int. Cl.
*H05K 1/00* (2006.01)
*G11B 21/00* (2006.01)

(52) U.S. Cl. .................. 29/603.03; 360/264.2; 439/67
(58) Field of Classification Search ............. 360/245.9, 360/264.2; 29/603.03; 439/559, 67
See application file for complete search history.

(56) References Cited

U.S. PATENT DOCUMENTS

| 5,317,801 | A | * | 6/1994 | Tanaka et al. ............... 29/830 |
| 5,644,452 | A |   | 7/1997 | Cox et al. .................. 360/106 |
| 5,886,858 | A |   | 3/1999 | Yanagihara ................. 360/106 |
| 6,480,362 | B1 |  | 11/2002 | Yoshida et al. ........... 360/264.2 |
| 2003/0002222 | A1 | * | 1/2003 | Abe ...................... 360/264.2 |

* cited by examiner

*Primary Examiner*—Angel A. Castro
(74) *Attorney, Agent, or Firm*—Kenyon & Kenyon LLP

(57) ABSTRACT

A method for mounting a head stack assembly (HSA) circuit assembly is disclosed. A flexible circuit substrate may be coupled to a stiffener. The stiffener may be a metal, such as aluminum, or some other stiff and durable material. The flexible circuit substrate may be made of an organic material and may have a series of electronic leads embedded in the flexible circuit substrate. The flexible substrate may be coupled to the stiffener by an adhesive or laminated onto the stiffener. The stiffener may be mounted onto the actuator arm by soldering or by laser welding.

6 Claims, 5 Drawing Sheets

METHOD OF HEAD STACK ASSEMBLY FLEXIBLE CIRCUIT ASSEMBLY ATTACHED TO AN ACTUATOR ARM

RELATED APPLICATIONS

This application is a Divisional of U.S patent application Ser. No. 10/753,911, filed on Jan. 7, 2004, which claims the benefit of priority to PCT/CN03/00570, filed on 18 Jul. 2003.

BACKGROUND INFORMATION

The present invention relates to magnetic hard disk drives. More specifically, the present invention relates to a method of assembling actuator driving mechanisms.

In the art today, different methods are utilized to improve recording density of hard disk drives. FIG. 1 provides an illustration of a typical disk drive. The typical disk drive has a head gimbal assembly (HGA) configured to read from and write to a magnetic hard disk 101. The HGA and the magnetic hard disk 101 are mounted to the base 102 of a main board 103. The disk 101 is rotated relative to the base 102 by a spindle motor 104. The HGA typically includes an actuator arm 105 and a load beam 106. The HGA supports and positions a magnetic read/write slider 107 above the magnetic hard disk 101. The slider may contain transducers to perform the read/write function. The HGA is rotated relative to the base 102 along the axis of a pivot bearing assembly 108 by an actuator frame 109. The actuator frame 109 contains an actuator coil 110 driven by a magnet 111. A relay flexible printed circuit 112 connects a board unit 113 to the transducer of the magnetic read/write slider 107. The signal from the transducer is amplified by the preamplifier 114 before being transmitted along the relay flexible printed circuit.

The relay flexible printed circuit 112 may be attached by pin soldering. However, the "flux" that is essential for this pin soldering causes a couple of problems. First, the cleaning process must be immediately implemented to remove the flux with soldering. Next, the tin contained in the solder causes pollution of the contacts.

DETAILED DESCRIPTION

A method for mounting a head stack assembly (HSA) circuit assembly is disclosed. In one embodiment, a flexible circuit substrate may be coupled to a stiffener. The stiffener may be a metal, such as aluminum, or some other stiff and durable material. The flexible circuit substrate may be made of an organic material and may have a series of electronic leads embedded in the flexible circuit substrate. The flexible substrate may be coupled to the stiffener by an adhesive or laminated onto the stiffener. The stiffener may be mounted onto the actuator arm by soldering or by laser welding.

Figure 1:
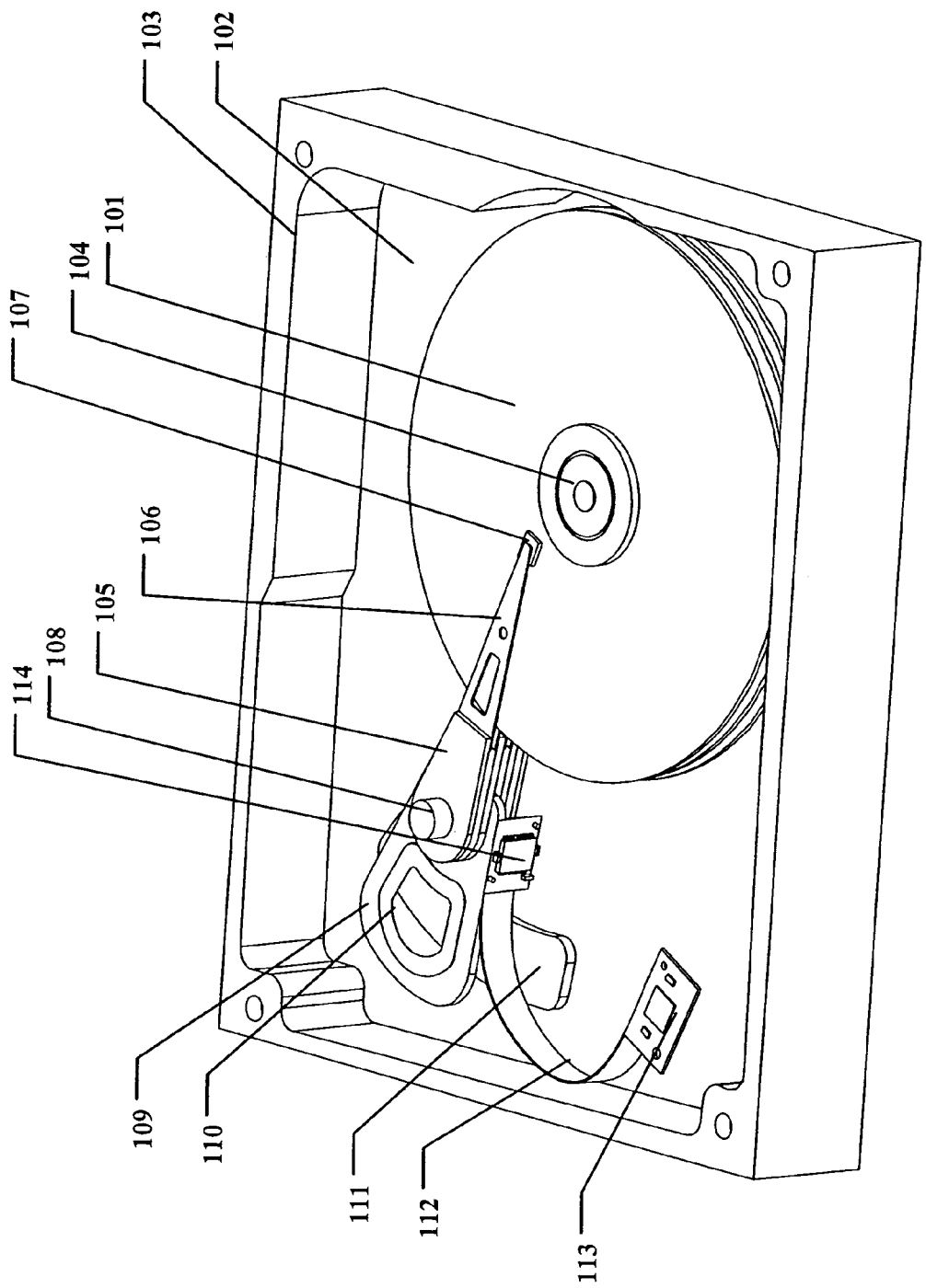
FIG. 1 provides an illustration of a typical disk drive.
Figure 2:
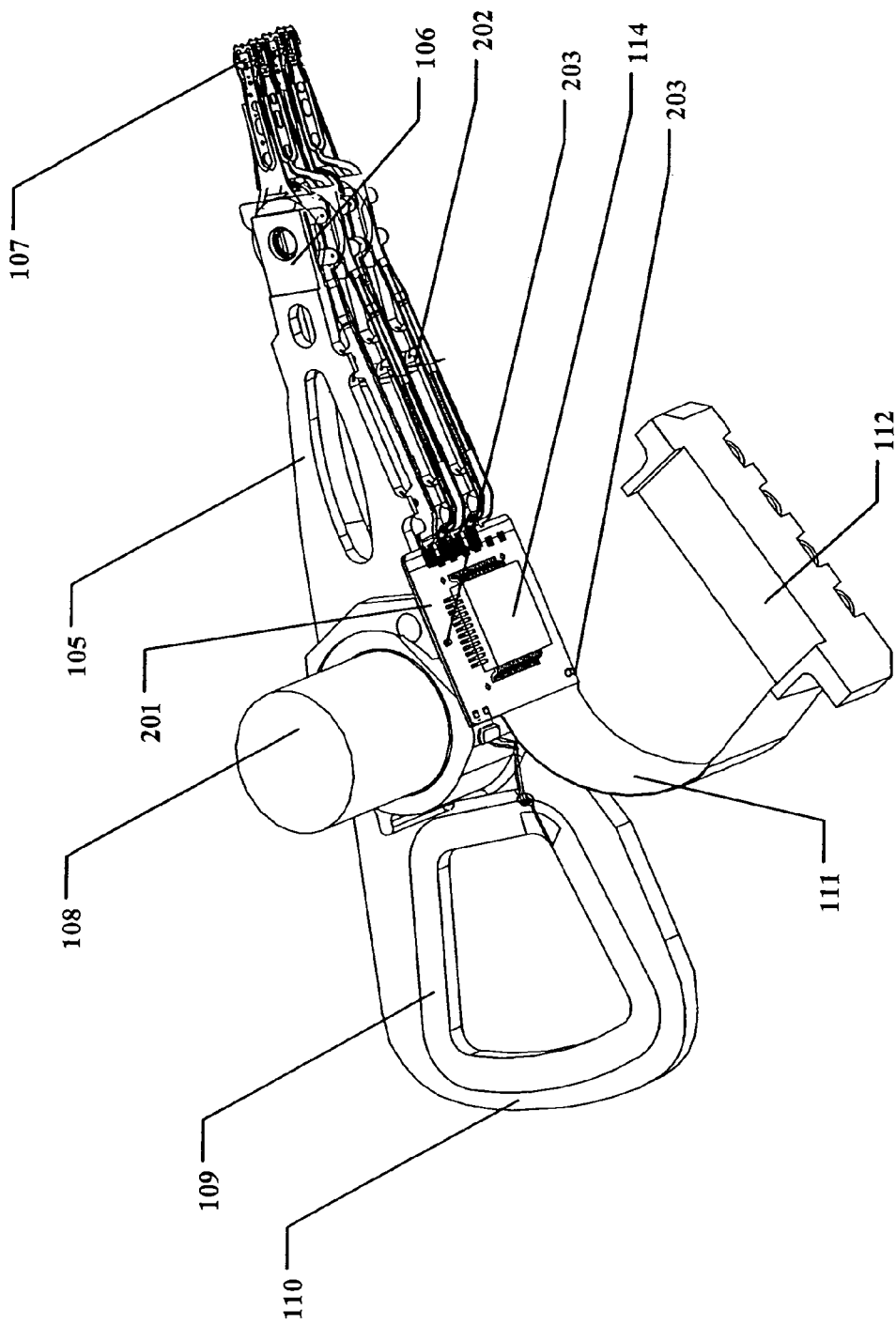
FIG. 2 provides an illustration of one embodiment of a head stack assembly with a flexible circuit substrate.

FIG. 2 provides an illustration of one embodiment of a head stack assembly with a flexible circuit substrate 201. A plurality of head gimbal assemblies may be coupled to the pivot bearing assembly 108. A suspension flexible circuit trace 202 may be attached to each load beam 106 and actuator arm 105, and may run from a transducer of each slider 107 to a single flexible circuit substrate 201. The flexible circuit substrate 201 may be made from an organic material. The actuator arm may be made of aluminum and manufactured by machining. The flexible circuit substrate 201 may be a substrate with a number of bond pads and a preamplifier chip 114 for signal processing. Each set of bond pads may be associated with a suspension flexible circuit trace 202. One or more leads running from the bond pads to the preamplifier 114 may be embedded in the flexible circuit substrate 201. The suspension flexible circuit trace 202 may be placed over these bonding pads on the flexible circuit substrate 201 to be electrically coupled to the flexible circuit substrate 201. To accomplish this, the termination pad of suspension flexible circuit trace 202 may be bonded to the corresponding bond pad on the flexible circuit substrate 201. For example, soldering or ultrasonic bonding may be used to connect the suspension flexible circuit trace 202 to the bond pads on the flexible circuit substrate 201 for a head stack assembly (HSA). One or more location pins 203 may be used to solder the flexible circuit substrate 201 in place. The location pins 203 would extend from the actuator arm 105 up through the flexible circuit substrate 201. The flexible circuit substrate 201 may be connected to a control circuit 112 by a flexible circuit assembly 111. In addition to controlling the read/write functions of the transducer of the slider 107, the control circuit 112 may also control the movement of the actuator frame 109.

Figure 3:
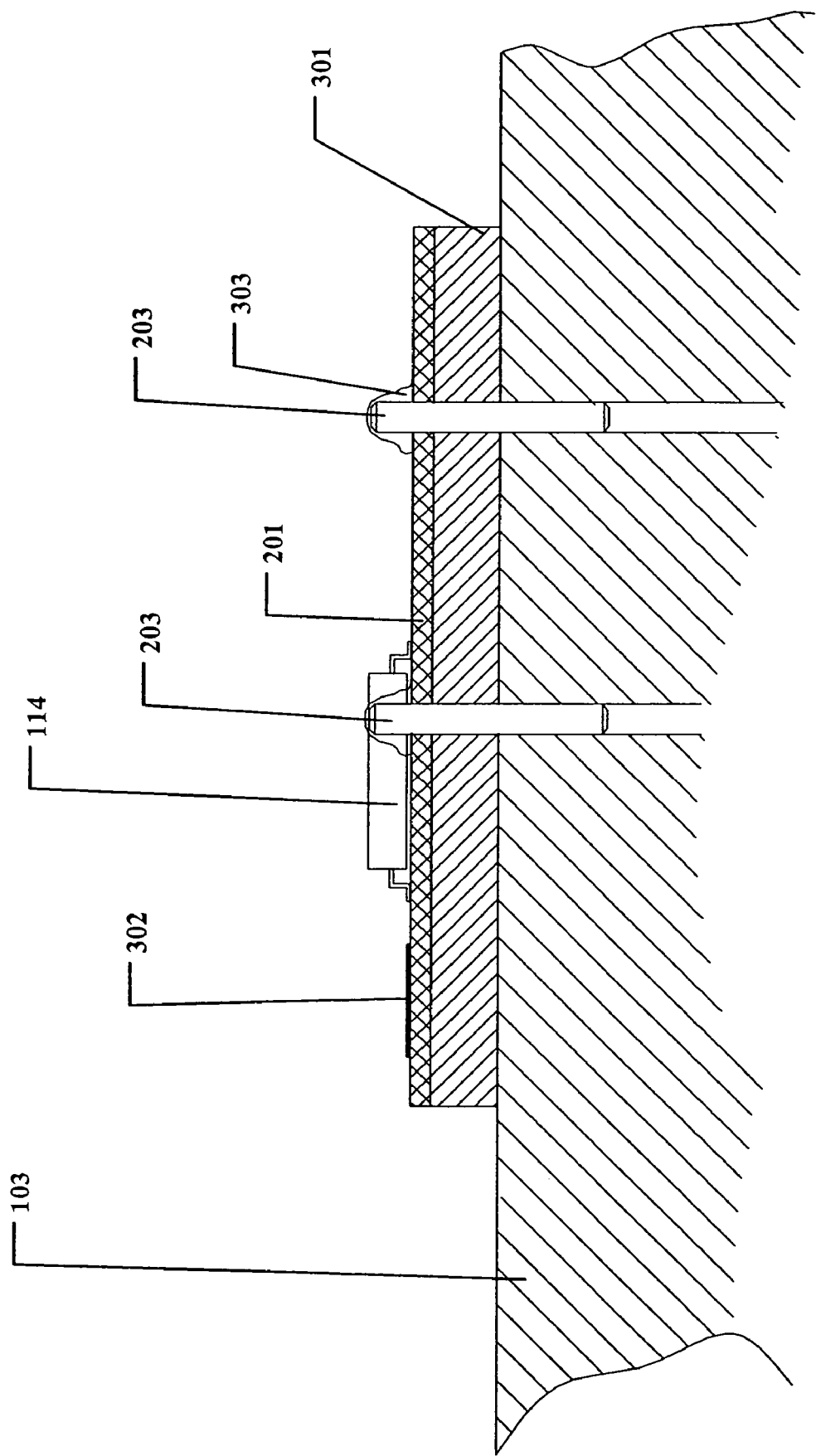
FIG. 3 provides a cross-section illustration of one embodiment of the mounting of the flexible circuit substrate on the actuator arm.

FIG. 3 provides a cross-section illustration of one embodiment of the mounting of the flexible circuit substrate 201 on the actuator arm 105. The flexible circuit substrate 201 may be coupled to a stiffener 301 that facilitates mounting the flexible circuit substrate 201 to the actuator arm 105. The stiffener 301 may be made of aluminum, or some other durable material or metal. The flexible circuit substrate 201 may be coupled to the stiffener 301 using an adhesive, such as an epoxy. The preamplifier 114 and the suspension flexible circuit trace 202 bond pads 302 may be coupled to the flexible circuit substrate 201. One or more location pins 203 may extend up from the actuator arm 105 through the stiffener 301 and the flexible circuit substrate 201. The location pins 203 may be made from metal and mounted on the actuator arm 105 by press-fitting. The stiffener 301 and the flexible circuit substrate 201 may be then coupled to the location pins 203 by applying a solder ball 303 and soldering the stiffener 301 and flexible circuit substrate 201 in place.

Figure 4:
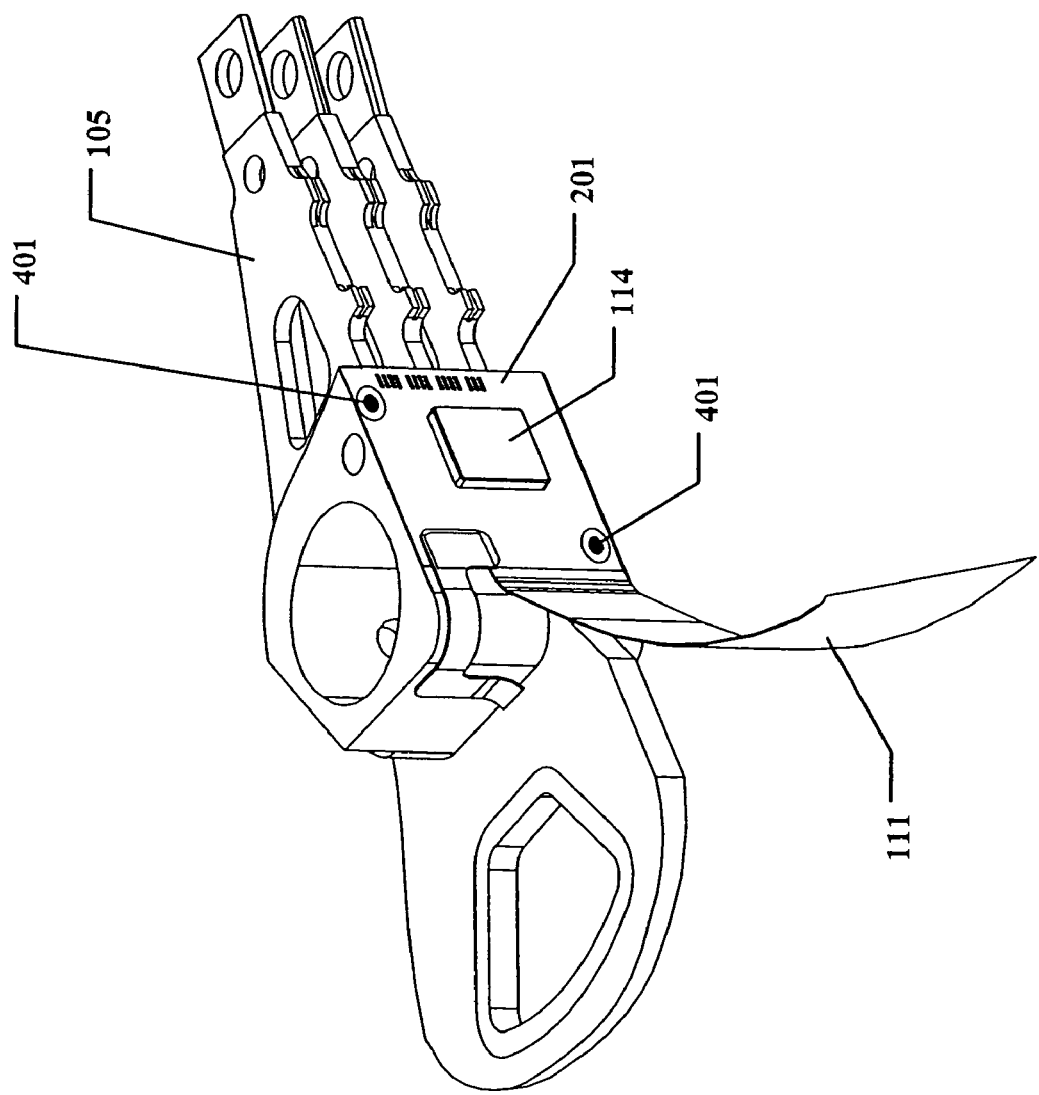
FIG. 4 provides an illustration of an alternate embodiment of a head stack assembly with a flexible circuit substrate.

FIG. 4 provides an illustration of an alternate embodiment of a head stack assembly with a flexible circuit substrate 201. In this embodiment, the flexible circuit substrate 201 and stiffener 301 may be mounted on the actuator arm 105 using laser welding. The stiffener 301 may be laser welded to the actuator arm 105 at one or more points 401.

Figure 5:
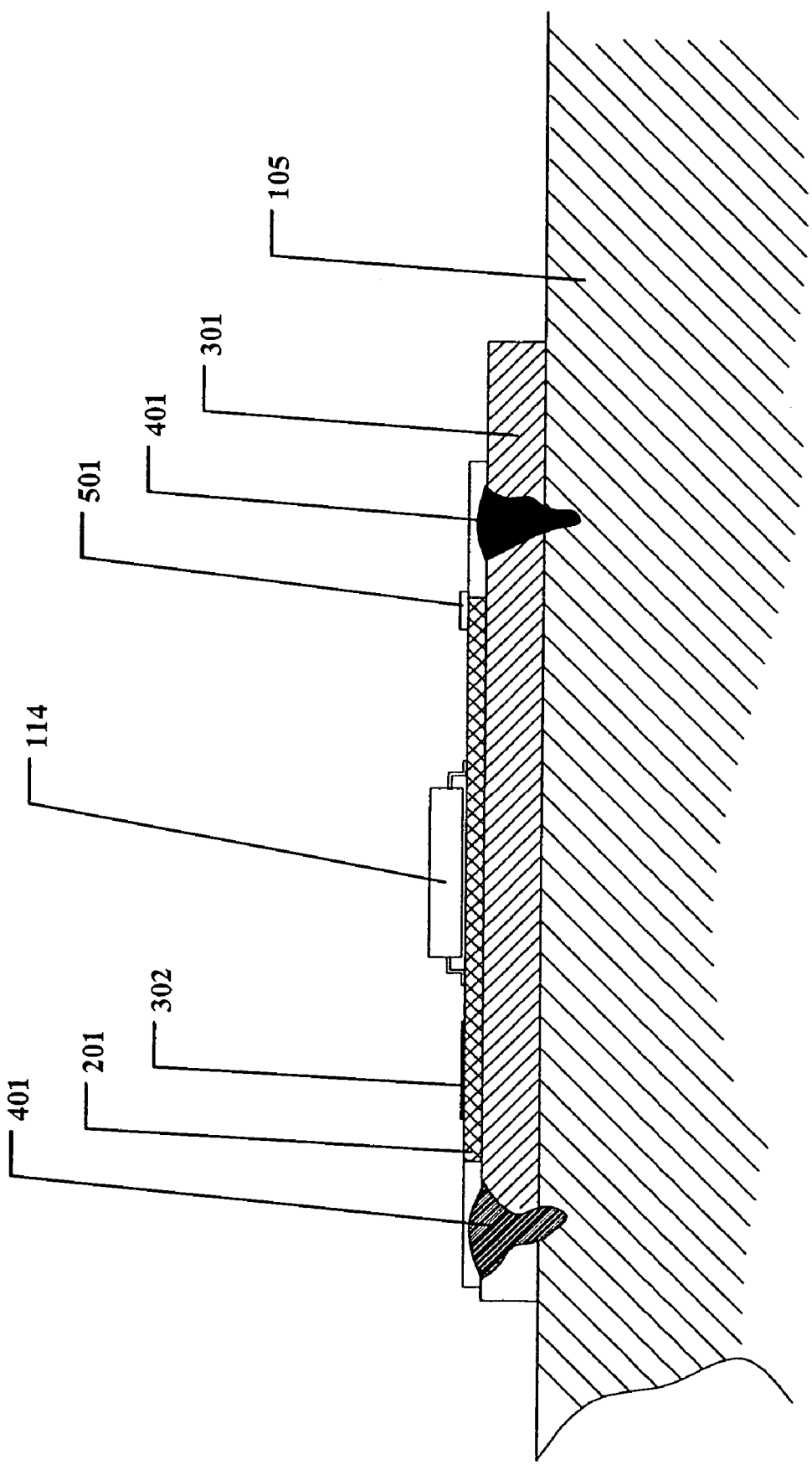
FIG. 5 provides a cross-section illustration of the alternate embodiment of the mounting of the flexible circuit substrate on the actuator arm.

FIG. 5 provides a cross-section illustration of the alternate embodiment of the mounting of the flexible circuit substrate 201 on the actuator arm 105. The flexible circuit substrate 201 and the stiffener 301 may be preliminarily combined with an adhesive and forms a lamination structure. Electrical elements 501 and bonding pads 302 may be added to the flexible circuit substrate 201 during the lamination process. The HSA circuit assembly may be aligned and then fixated onto the plane of an actuator arm. One laser beam may be applied to the metal stiffener for a predetermined period of time to make the specific welding spot 401 between the stiffener 301 and flexible circuit substrate 201. The welding spots 401 may be produced by melting the metal stiffener 301 and actuator arm 105 by some means of concentrated heat energy, producing a fairly clean, non-contaminated connection. Good reliability and high bonding strength is achieved with this mounting operation, probably requiring no further cleaning. The welding spots 401 may be arranged on the metal stiffener 301 according to the needs and structure of specific HSA.

Although several embodiments are specifically illustrated and described herein, it will be appreciated that modifications and variations of the present invention are covered by the above teachings and within the purview of the appended claims without departing from the spirit and intended scope of the invention.

The invention claimed is:

1. A method, comprising:
   electrically coupling a slider to at least one actuator pad with a flexible circuit substrate; and
   mounting the flexible circuit substrate to an actuator arm with a stiffener between the flexible circuit substrate and the actuator arm, wherein the stiffener is mounted to the actuator arm by soldering at least one pin extending from the actuator arm through the stiffener and the flexible substrate and wherein the at least one pin extends in direct contact with the stiffener and the flexible substrate.

2. The method of claim 1, wherein the stiffener is made of aluminum.

3. The method of claim 1, wherein the flexible circuit substrate is made of an organic material.

4. The method of claim 3, wherein the flexible circuit substrate has at least one embedded lead connecting the slider to the at least one actuator pad.

5. The method of claim 1, further comprising coupling the flexible circuit substrate to the stiffener with an adhesive.

6. The method of claim 1, further comprising mounting the stiffener to the actuator by laser welding the stiffener to the actuator arm.

\* \* \* \* \*